(12) United States Patent  
Shih et al.

(10) Patent No.: US 9,156,555 B2  
(45) Date of Patent: Oct. 13, 2015

(54) DESK ASSEMBLY FOR POSITIONING BOARD-LIKE ELECTRONIC DEVICE

(75) Inventors: Henry Shih, Yun-Lin County (TW); Wen-Ping Tsai, Yun-Lin County (TW); Chang-Hsien Lee, Yun-Lin County (TW)

(73) Assignee: Super Alloy Industrial Co., Ltd., Yun-Lin County (TW)

( * ) Notice: Subject to any disclaimer, the term of this patent is extended or adjusted under 35 U.S.C. 154(b) by 613 days.

(21) Appl. No.: 13/457,697

(22) Filed: Apr. 27, 2012

(65) Prior Publication Data

US 2013/0264298 A1    Oct. 10, 2013

(30) Foreign Application Priority Data

Apr. 9, 2012   (TW) .............................. 101112530 A

(51) Int. Cl.
```
A47F 7/00       (2006.01)
B64D 11/06      (2006.01)
F16M 11/10      (2006.01)
F16M 13/00      (2006.01)
```
(52) U.S. Cl.
CPC ............ *B64D 11/06* (2013.01); *B64D 11/0624* (2014.12); *B64D 11/0638* (2014.12); *F16M 11/10* (2013.01); *F16M 13/00* (2013.01)

(58) Field of Classification Search
CPC ................. B64D 11/0015; B64D 2011/0679; B64D 11/0638; B64D 11/0624; F16M 13/00; F16M 11/10; B60N 3/00; B60N 3/002; B60N 3/004; Y02T 50/46
USPC ........... 211/26, 26.2; 248/447, 450, 451, 456, 248/463, 917–923; 297/146, 163; 108/42–44, 47, 48, 152
See application file for complete search history.

(56) References Cited

U.S. PATENT DOCUMENTS

```
1,184,246  A  *   5/1916  Klein ............................ 248/448
1,208,622  A  *  12/1916  Muller .......................... 248/461
2,001,139  A  *   5/1935  Johnson ........................ 248/453
4,181,282  A  *   1/1980  Oliver et al. .................. 248/448
4,886,231  A  *  12/1989  Doerksen ...................... 248/455
5,655,651  A  *   8/1997  Maier ............................ 206/1.7
6,045,108  A  *   4/2000  Cziraky ........................ 248/454
6,679,468  B1 *   1/2004  Hsu .............................. 248/454
6,918,565  B2 *   7/2005  Chang .......................... 248/448
7,073,449  B2 *   7/2006  Pipkin ............................ 108/44
7,614,599  B2 *  11/2009  Moon et al. ................... 248/454
2007/0283855  A1* 12/2007  Pozzi ............................. 108/44
2013/0070171  A1*  3/2013  Boyer, Jr. ...................... 348/837
```

* cited by examiner

*Primary Examiner* — Korie H Chan  
(74) *Attorney, Agent, or Firm* — Rosenberg, Klein & Lee

(57) ABSTRACT

A desk assembly includes a desk top pivotably connected to a seat or the armrest of the seat, and includes an angle adjustment unit and a positioning portion. The desk top is flat and suitable for books or magazines put thereon. A rack is pivotably connected to the desk top and has a positioning unit. The rack is pivoted and positioned relative to the desk top so that the board-like electronic device such as cellular phone or board-like computer can be supported on the rack.

10 Claims, 17 Drawing Sheets

DESK ASSEMBLY FOR POSITIONING BOARD-LIKE ELECTRONIC DEVICE

FIELD OF THE INVENTION

The present invention relates to a desk assembly pivotably connected a seat and a positioning device which positions the board-like electronic device.

BACKGROUND OF THE INVENTION

As shown in FIG. 15, the conventional seat 6 on an airplane generally has a desk assembly 7 which is pivotably connected to the back of the seat 6 so that the passengers sit behind the seat 6 can put books or magazines on the desk assembly 7. The desk assembly 7 includes two arms 71 which are pivotably connected to the lower end of the seat 6 and the desk top of the desk assembly 7 is pivotable relative to the two arms 71. When the desk top is not in use, the desk top is pivoted and positioned on the back of the seat 6 by using a locking member 61 on the back of the seat 6.

The conventional desk assembly 7 is not designed for positioning the board-like electronic devices which are preferably positioned at an angle relative to the users. However, the conventional desk assembly 7 only provides a horizontal desk top and the users have to operate the board-like electronic device, this is not convenient for the users when using the board-like electronic devices.

The present invention intends to provide a desk assembly connected to the back of a seat and the desk assembly can position the board-like electronic device at an angle relative to the user.

SUMMARY OF THE INVENTION

The present invention relates to a desk assembly which comprises a desk top pivotably connected to a seat or the armrest of the seat, and has an angle adjustment unit and a positioning portion. The desk top is flat and suitable for books or magazines put thereon. A rack is pivotably connected to the desk top and has a positioning unit. The positioning unit includes a transverse bar which has a slide slot and two positioning members between. Anti-slip material is connected to the rack. The rack is pivoted and positioned relative to the desk top so that the board-like electronic device such as cellular phone or board-like computer can be supported on the anti-slip material the rack.

The primary object of the present invention is to provide a desk assembly which has a rack pivotable to the desk top so that the board-like electronic device can be supported on the rack and positioned at an angle relative to the user. Anti-slip material is connected to the rack so that the board-like electronic device is positioned.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
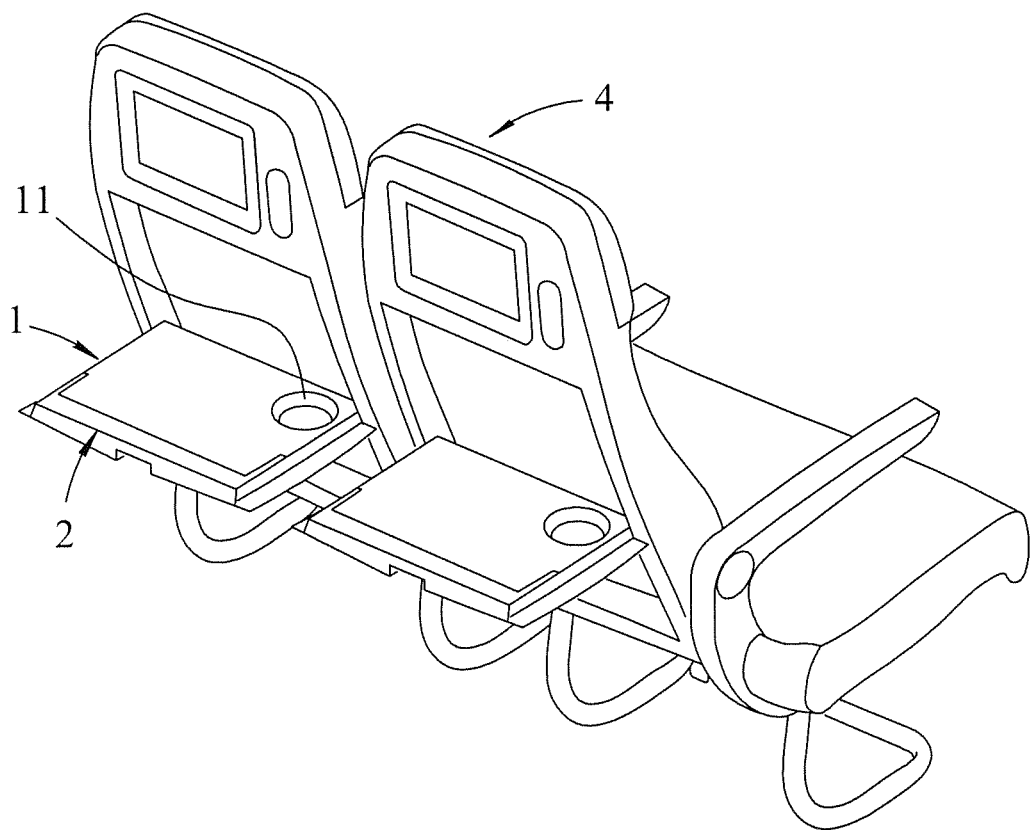
FIG. 1 is a perspective view to show that the desk assembly of the present invention is connected to the back of a seat.
Figure 2:
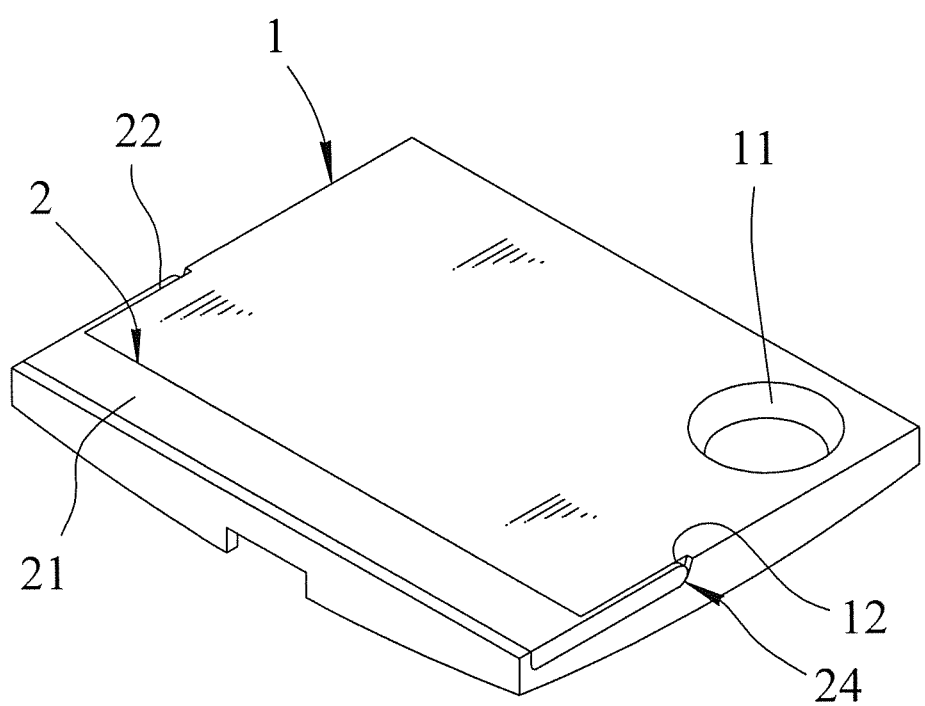
FIG. 2 is a perspective view to show that the desk assembly of the present invention is positioned horizontally.

Referring to FIGS. 1 to 4, the desk assembly of the present invention comprises a desk top 1, a rack 2, a positioning portion 3 and a seat 4. The desk top 1 is cooperated with the rack 2 and the positioning portion 3 to support a board-like electronic device 5 which is clamped or urged to be positioned.

Figure 5:
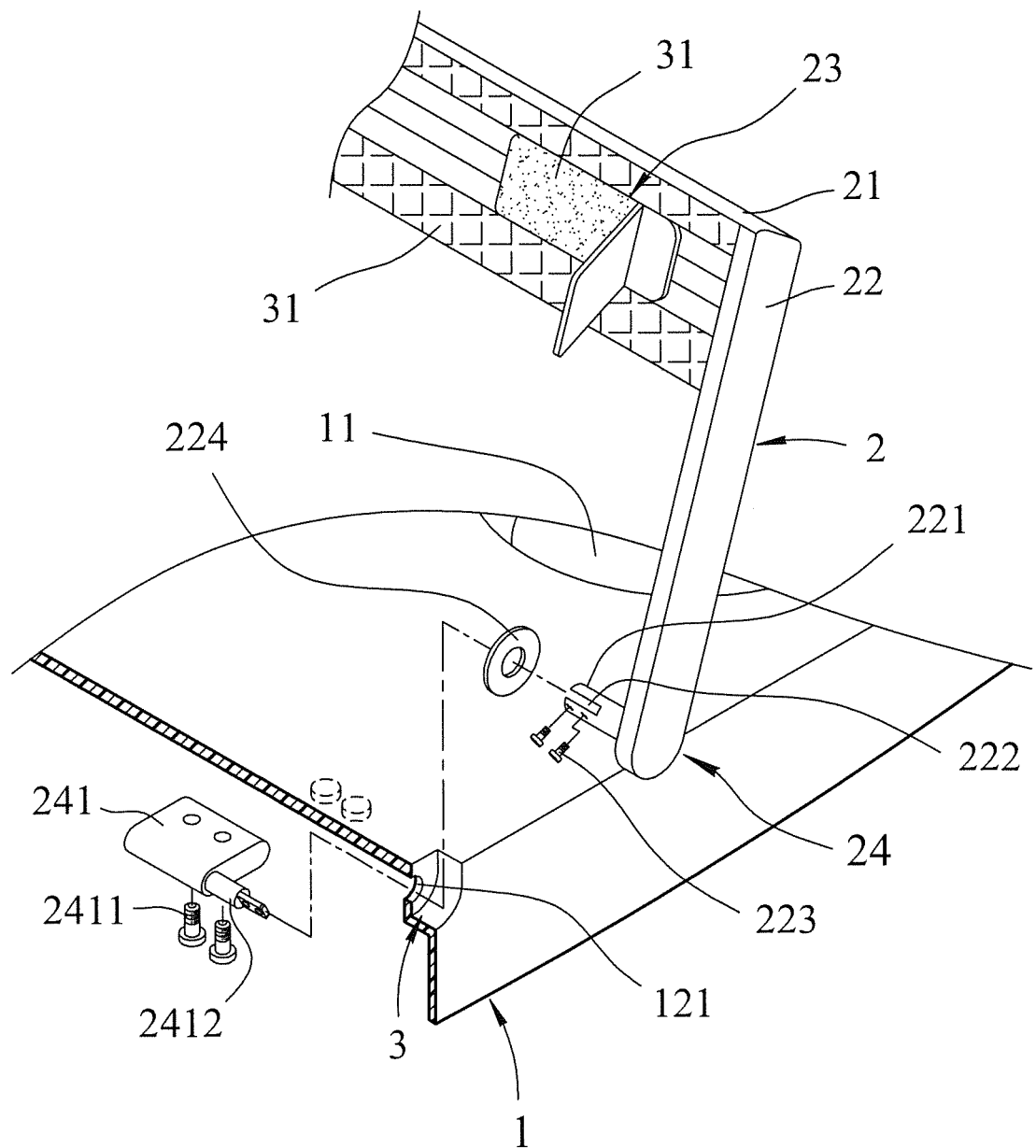
FIG. 5 is an exploded view to show the desk top, the frictional positioning unit and the rack of present invention.
Figure 8:
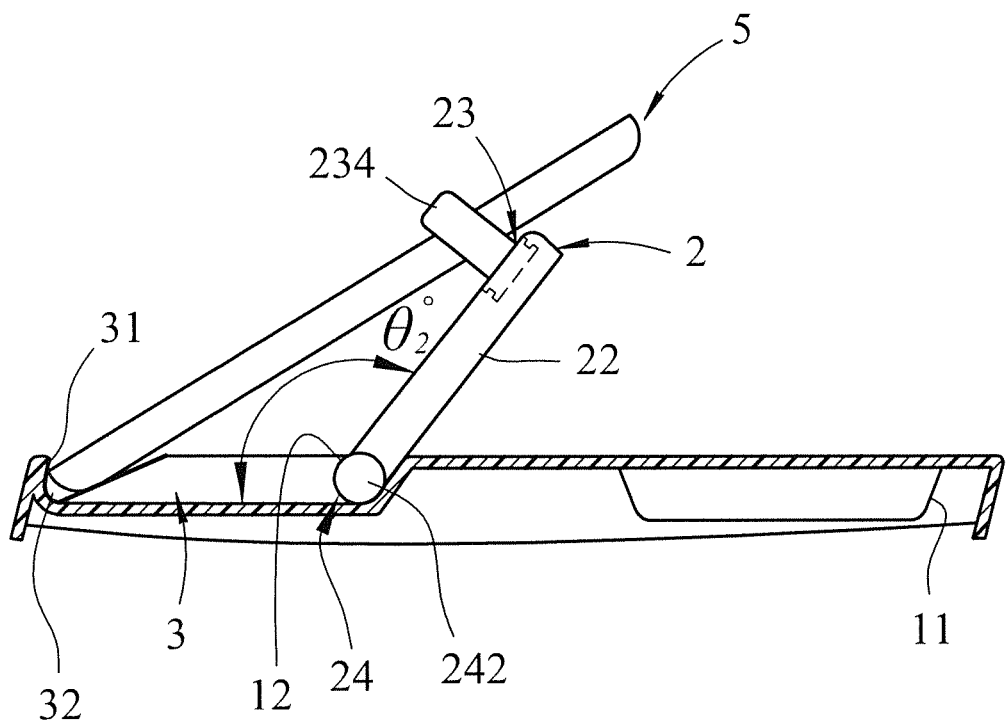
FIG. 8 is a partial cross sectional view to show that the rack is adjusted to another desired angle.
Figure 14:
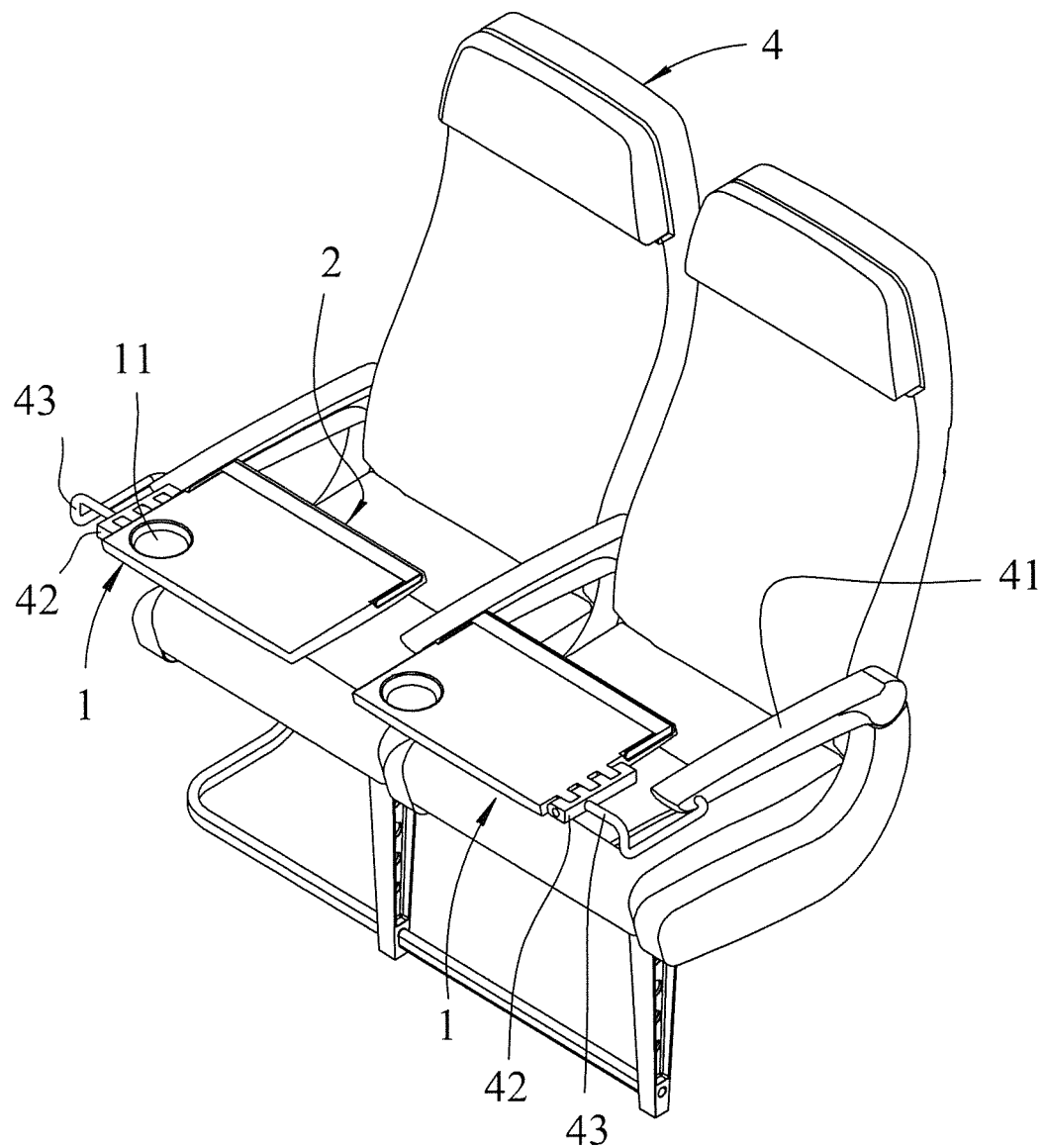
FIG. 14 shows that the desk assembly of the present invention is connected to the armrest of the seat.
Figure 15:
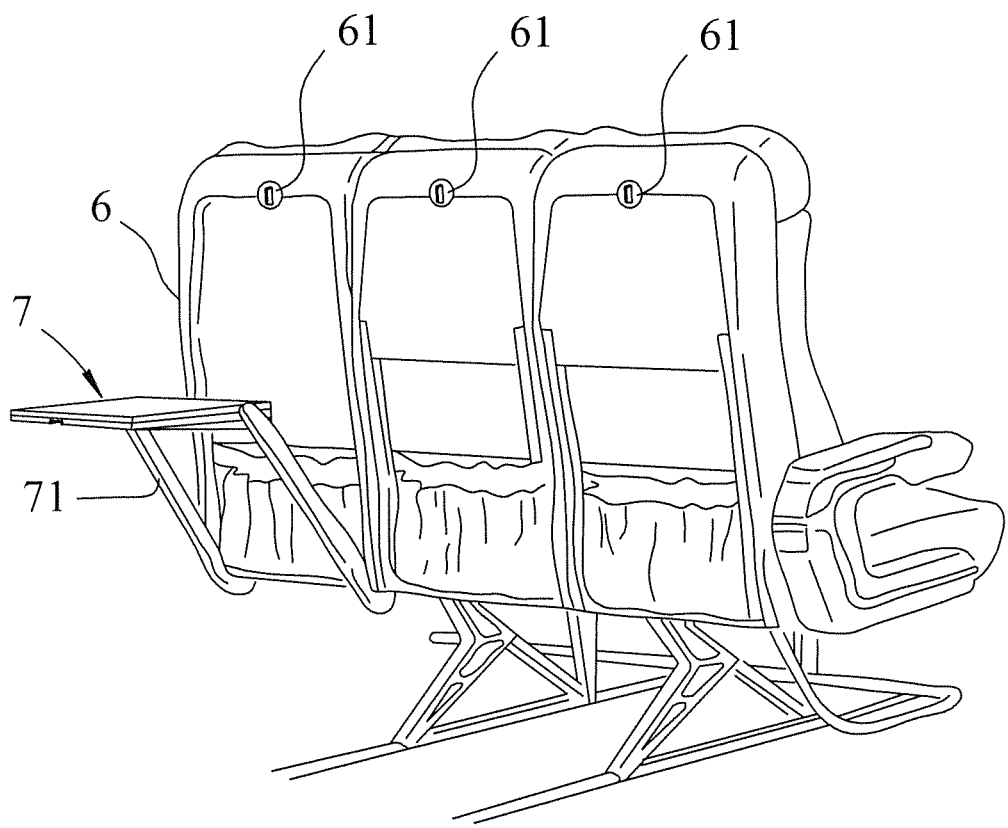
FIG. 15 shows the conventional desk assembly.

The desk top 1 is made by carbon fibers, metal, wood, plastic or any desired material, and the desk top 1 is pivotably connected to the back of the seat 4 or to the armrest 41 of the seat 4 as shown in FIG. 14. The seat 4 is installed to cars, trains, buses, planes, or boats. The desk top 1 has the angle adjustment unit 24 connected thereto which sets the rack 2 at the desired angle. As shown in FIG. 5, the angle adjustment unit 24 is a friction hinge 241 or a locking knob 242 (FIG. 8). The frictional hinge 241 is disclosed in U.S. RE37712E and any known device such as ratchet mechanism or locking knob can also achieve the same function.

The rack 2 comprises a transverse bar 21 and two arms 22 which are connected to two ends of the transverse bar 21. The two arms 22 are pivotably connected to the desk top 1. The rack 2 has a positioning unit 23 which has a slide slot 231 defined in the transverse bar 21 and at least two positioning members 232 are slidably engaged with the slide slot 231. The slide slot 231 is a toothed rack or a groove. The positioning member 232 is engaged with or urged to the slide slot 231. Each of the two positioning members 232 has a stop 234 which is pivotably connected to the positioning member 232. Anti-slip material 31 is connected to transverse bar 21 of the rack 2.

Figure 3:
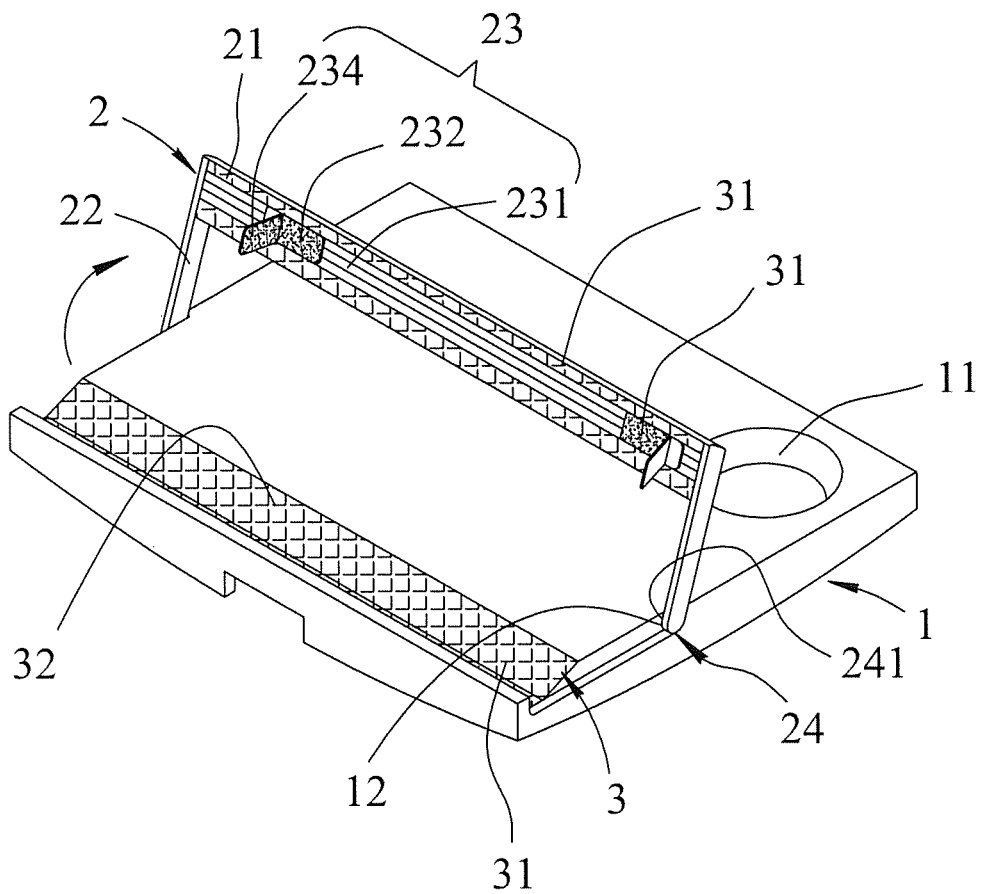
FIG. 3 shows that the rack is pivoted and position relative to the desk top of the desk assembly of the present invention.
Figure 6:
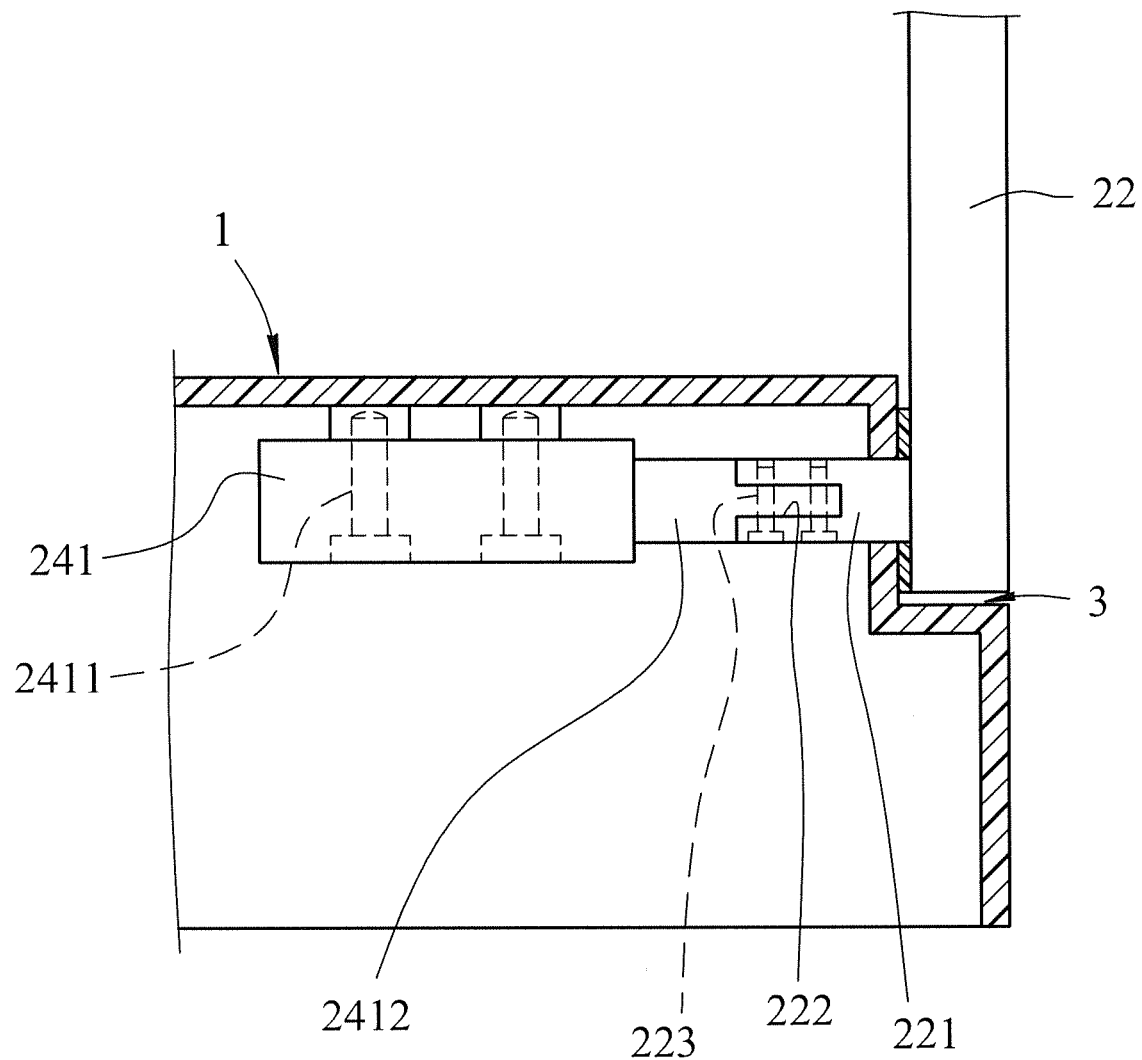
FIG. 6 is a cross sectional view of the connection of the desk top, the frictional positioning unit and the rack of present invention.

There are two embodiments for the connection between the rack 2 and the desk top 1, as shown in FIG. 3 which shows the first embodiment, the rack 2 is pivoted toward the back of the seat 4. The second embodiment is disclosed in FIG. 13 and shows that the rack 2 is pivoted away from the back of the seat 4. As shown in FIGS. 5 and 6, two passages 121 are defined in the two pivotal positions 12 of the desk top 1 and the pivotal ends 221 of the two arms 22 of the rack 2 are pivotably connected to the passages 121. The frictional positioning unit 241 is connected to the underside of the desk top 1 by multiple bolts 2411. The frictional positioning unit 241 has a pivot 2412 which has an elongate and flat end which is engaged with the engaging slot 222 defined in the pivotal end 221 of the arm 22. Multiple bolts 223 are used to fix the pivot 2412 to the engaging slot 222. A washer 224 is located between the side of the desk top 1 and the arm 22 to reduce the friction between the side of the desk top 1 and the arm 22.

Figure 13:
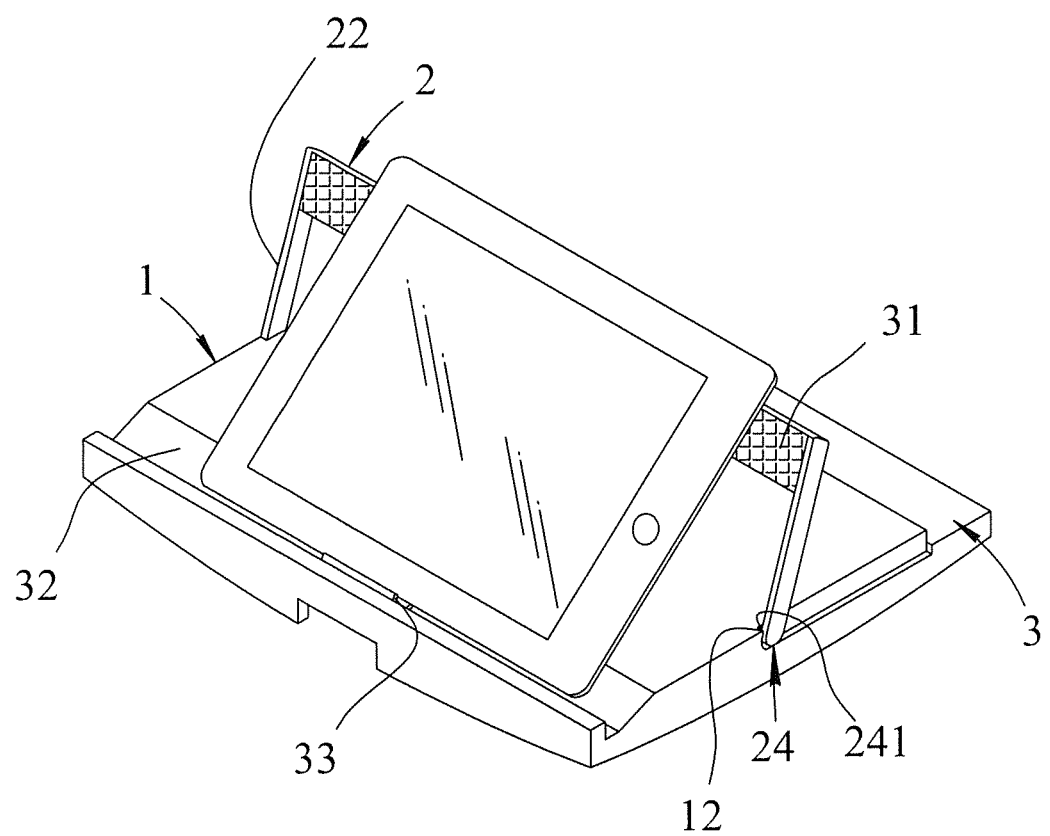
FIG. 13 shows that the rack in FIG. 12 is pivoted.

The positioning portion 3 of the desk top 1 has anti-slip material 31 connected thereto and the positioning portion 3 can be a groove 32 as shown in FIG. 3 or a support member 33 as shown FIG. 13.

Figure 4:
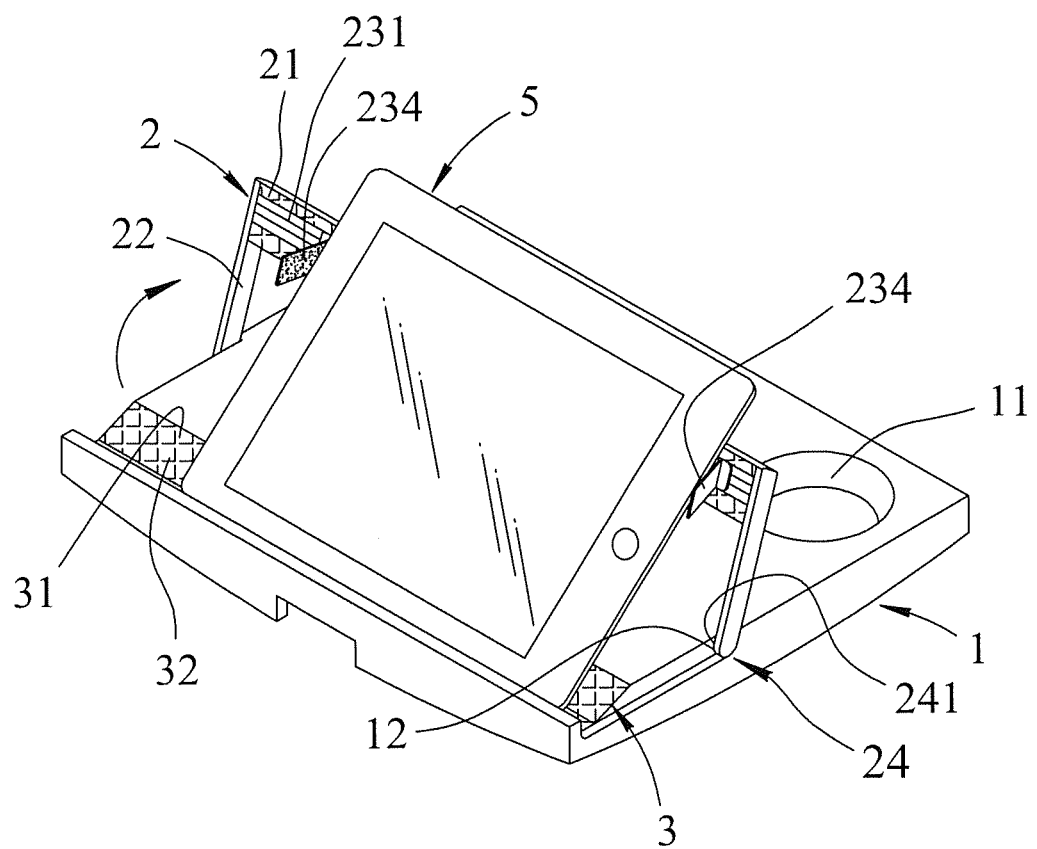
FIG. 4 shows that a board-like electronic device is supported on the rack of the desk assembly of the present invention.

As shown in FIG. 4, the positioning portion 3 of the desk top 1 is a groove to accommodate the rack 2 so that the top of the desk top 1 is flat. The flat desk top 1 is suitable for the user to put objects and when the desk top 1 is folded toward the seat 4, less space is occupied. The user has more leg space and the desk top 1 is easily pivoted downward to form a horizontal desk top.

Figure 7:
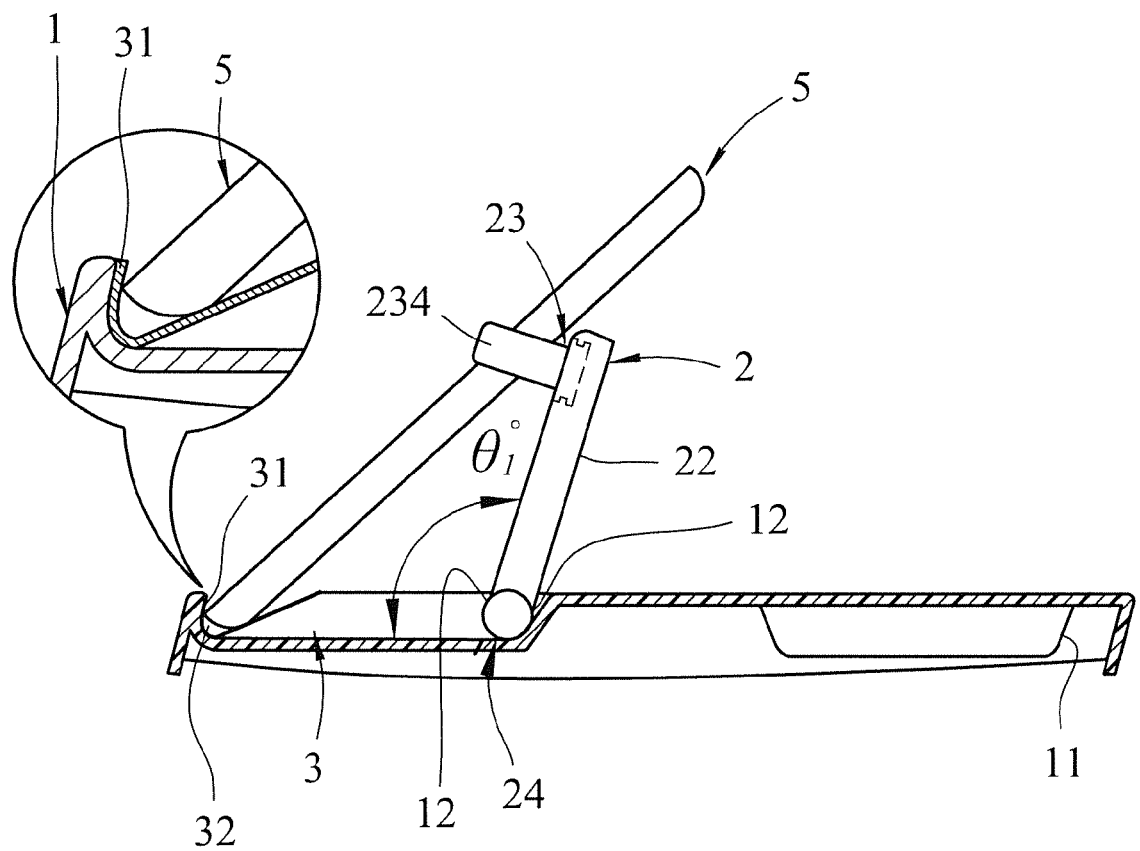
FIG. 7 is a partial cross sectional view to show that the rack is adjusted to a desired angle.

As shown in FIGS. 7 and 8, when the user wants to use the board-like electronic device 5, the desk top 1 is pivoted downward to be positioned horizontally and the rack 2 is pivoted and set a desired angle by the use of the friction hinge 241. The rack 2 is pivoted to the angle θ1 as shown in FIG. 7. As shown in FIG. 8, the rack 2 can be further pivoted to the angle θ2 as needed. The two positioning members 232 are moved along the slide slot 231 to have a proper distance between two positioning members 232. The board-like electronic device 5 is located between the two positioning members 232 and clamped by the two stops 234.

Figure 9A:
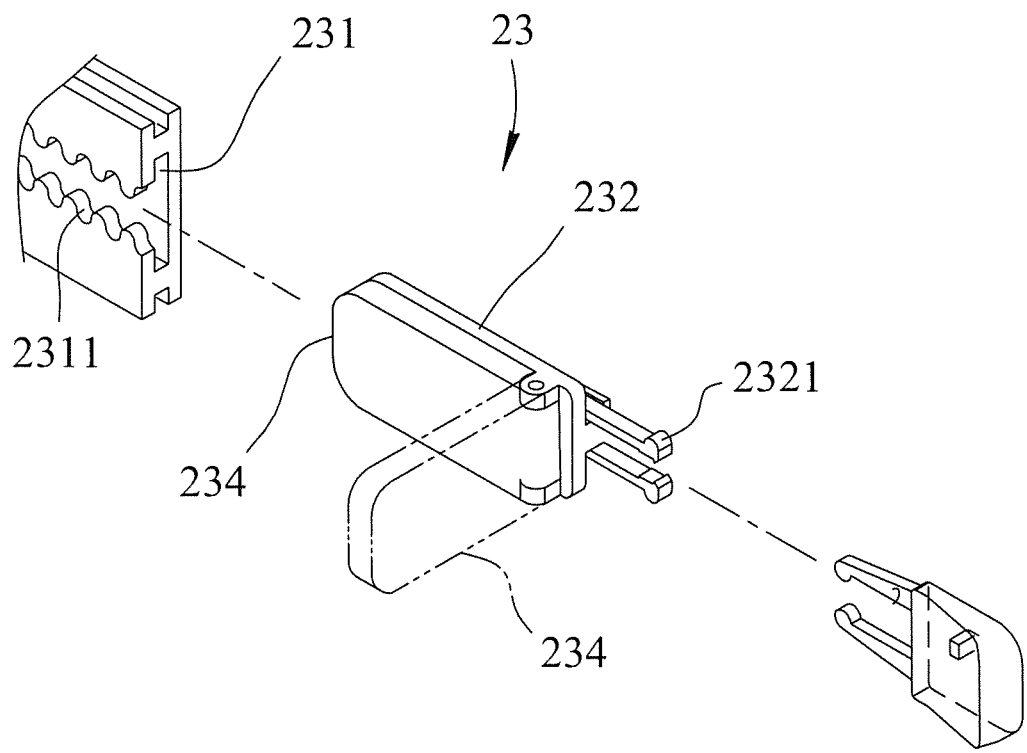
FIG. 9a shows the first embodiment of the positioning unit of the rack of the present invention.
Figure 9B:
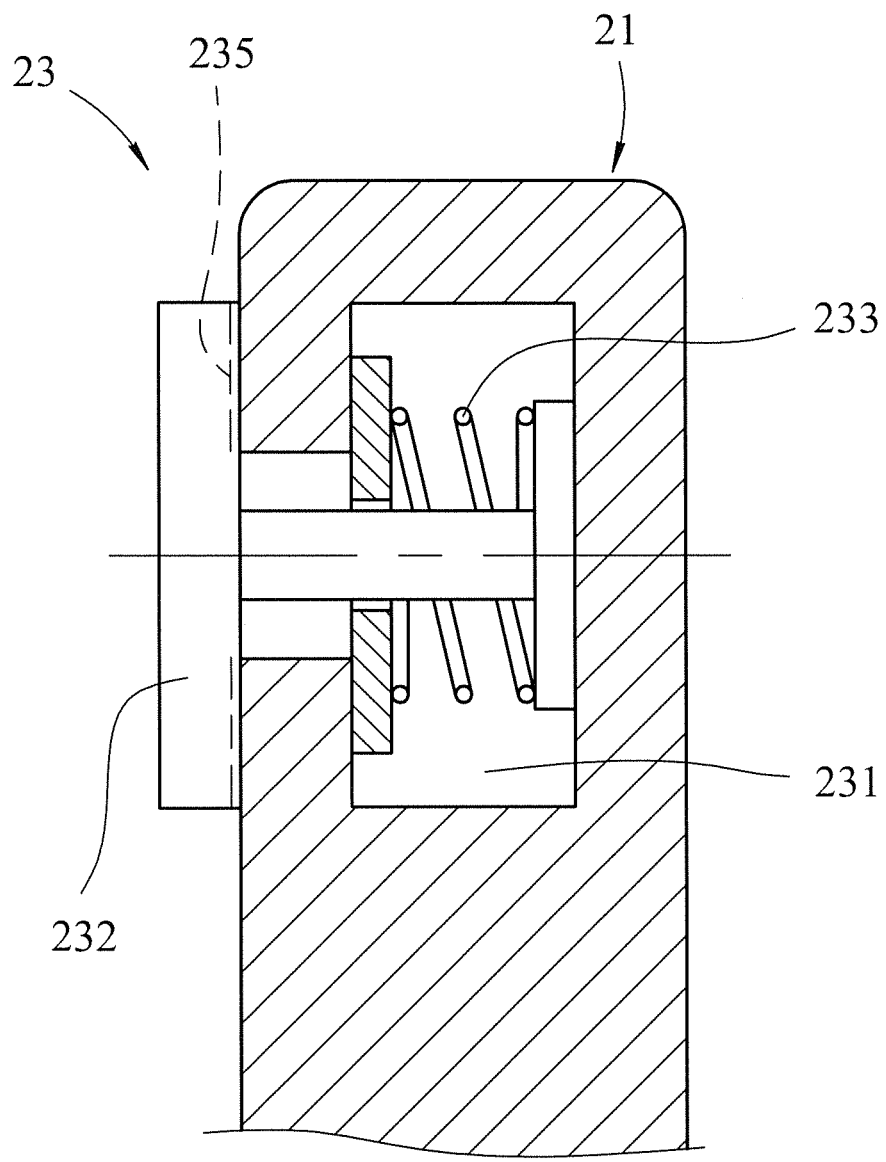
FIG. 9b shows the second embodiment of the positioning unit of the rack of the present invention.
Figure 9C:
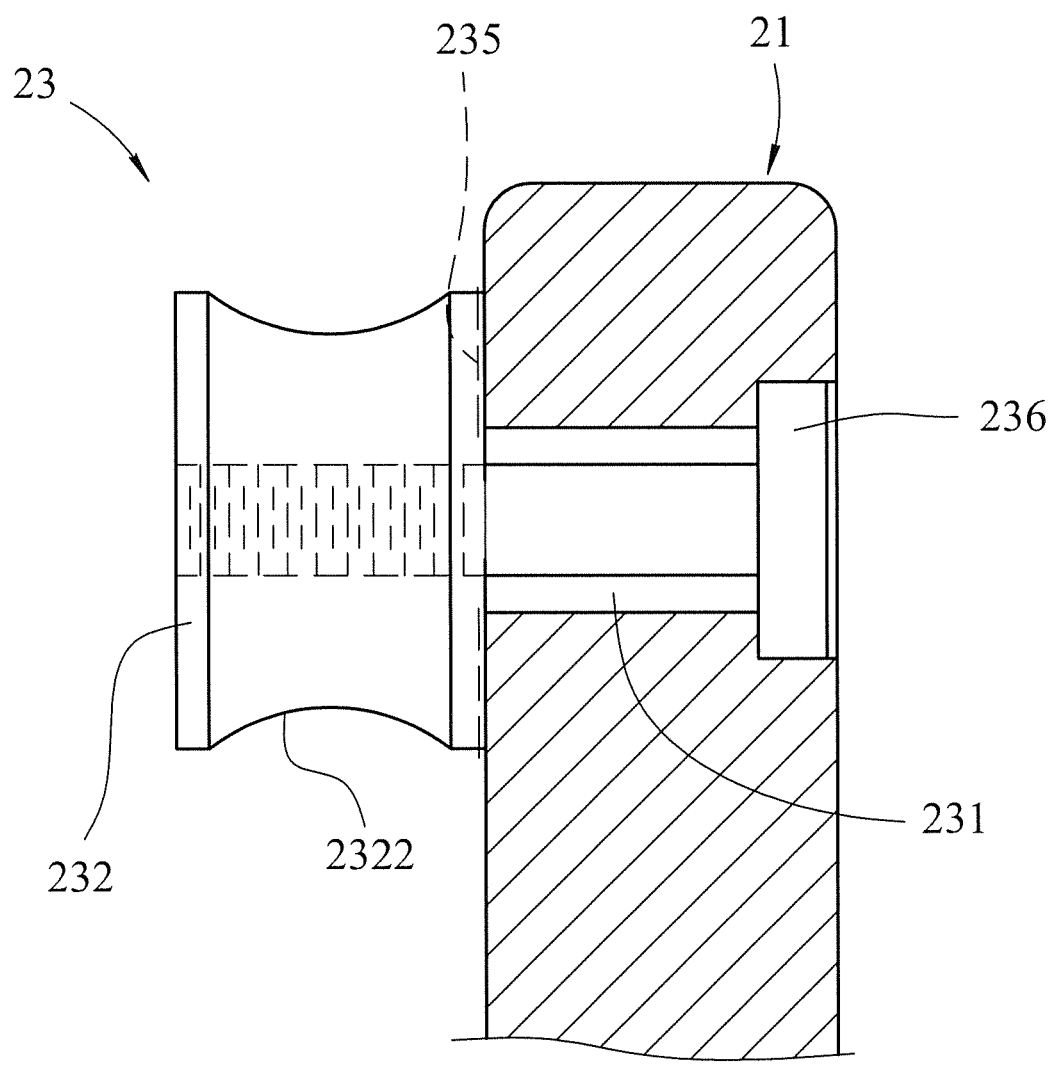
FIG. 9c shows the third embodiment of the positioning unit of the rack of the present invention.

The positioning unit 23 has three embodiments which are shown in FIGS. 9a, 9b and 9c. As shown in FIG. 9a, the protrusions 2321 of the positioning member 232 are engaged with the notches 2311 of the slide slot 231 when the positioning member 232 is slid along the slide slot 231 to set the position of positioning member 232.

FIG. 9b shows that the distal end of the positioning member 232 is located in the slide slot 231 and a resilient member 233 is biased between the inside of the slide slot 231 and the positioning member 232. The resilient member 233 generates the friction between the inside of the slide slot 231 and the positioning member 232 so as to position the positioning member 232. The inside of the slide slot 231 may have a serrated surface to position the positioning member 232. When adjusting the positioning member 232, the positioning member 232 is pulled to compress the resilient member 233 and then moved to the desired position. The positioning member 232 is then released to be positioned at the desired position.

FIG. 9c shows that the positioning member 232 is made by resilient and plastic material such as rubber, and has head with a curved surface 2322 defined in the periphery thereof. A bolt 236 extends through the slide slot 231 and is connected to the positioning member 232. When adjusting the positioning member 232, the positioning member 232 is rotated to be loose relative to the bolt 236 and then moved to the desired position. The positioning member 232 is rotated to be right again to be set at the desired position. The board-like electronic device 5 is engaged with the curved surface 2322.

Figure 10:
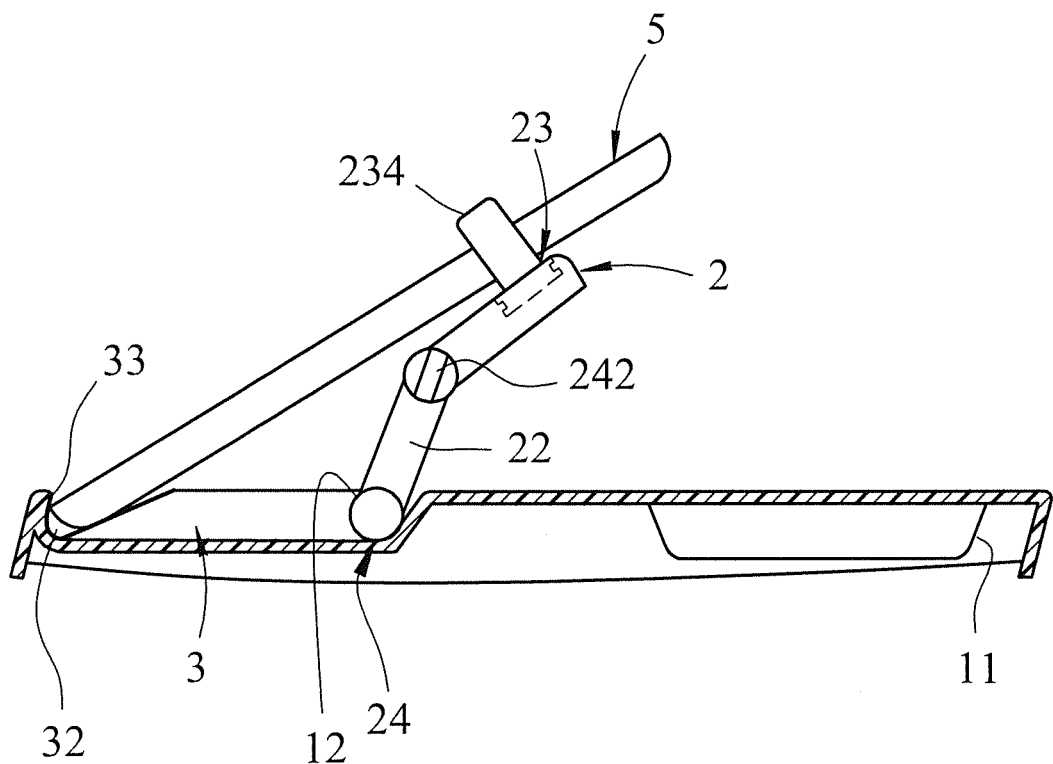
FIG. 10 shows a side view of another embodiment of the rack of the present invention.
Figure 11:
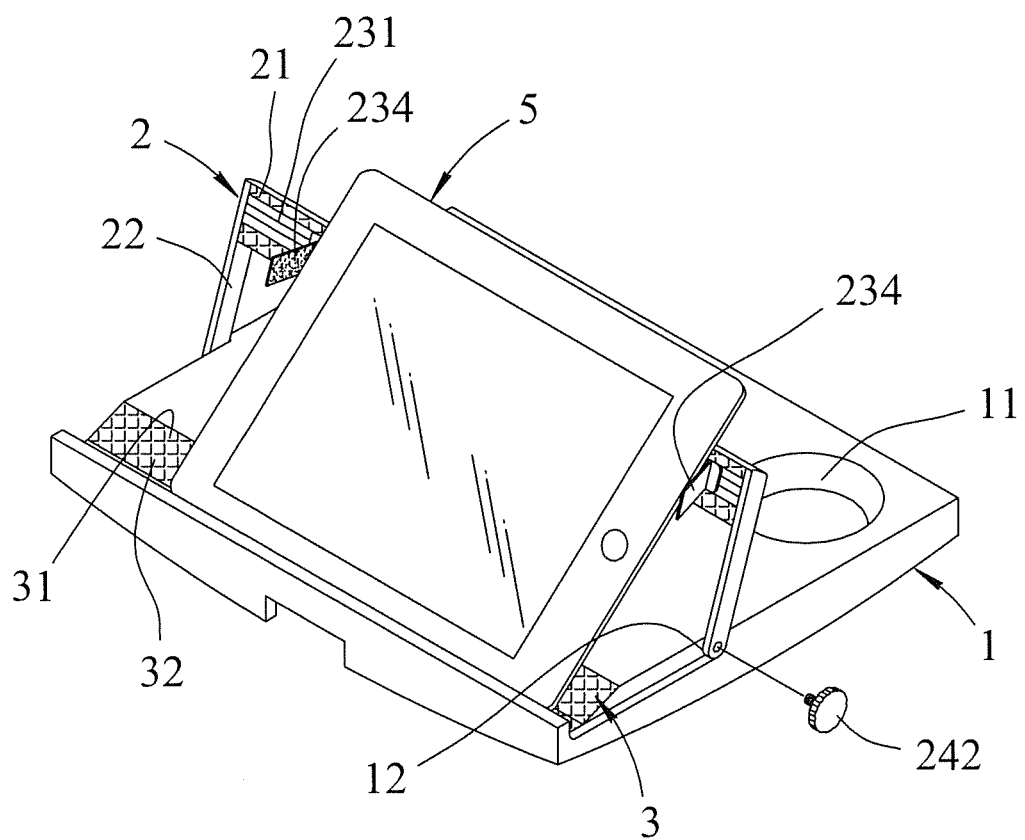
FIG. 11 shows another embodiment of the angle adjustment unit of the rack of the present invention.

FIGS. 10 and 11 show that the angle adjustment unit 24 can be a locking knob 242 which is pivotably connected to the pivotal position between the rack 2 and the desk top 1 as shown in FIG. 11. Alternatively, the locking knob 242 is pivotably connected to the mediate portion of the arm 22 so that the user can operate the locking knob 242 to set the inclination of the rack 2.

Figure 12:
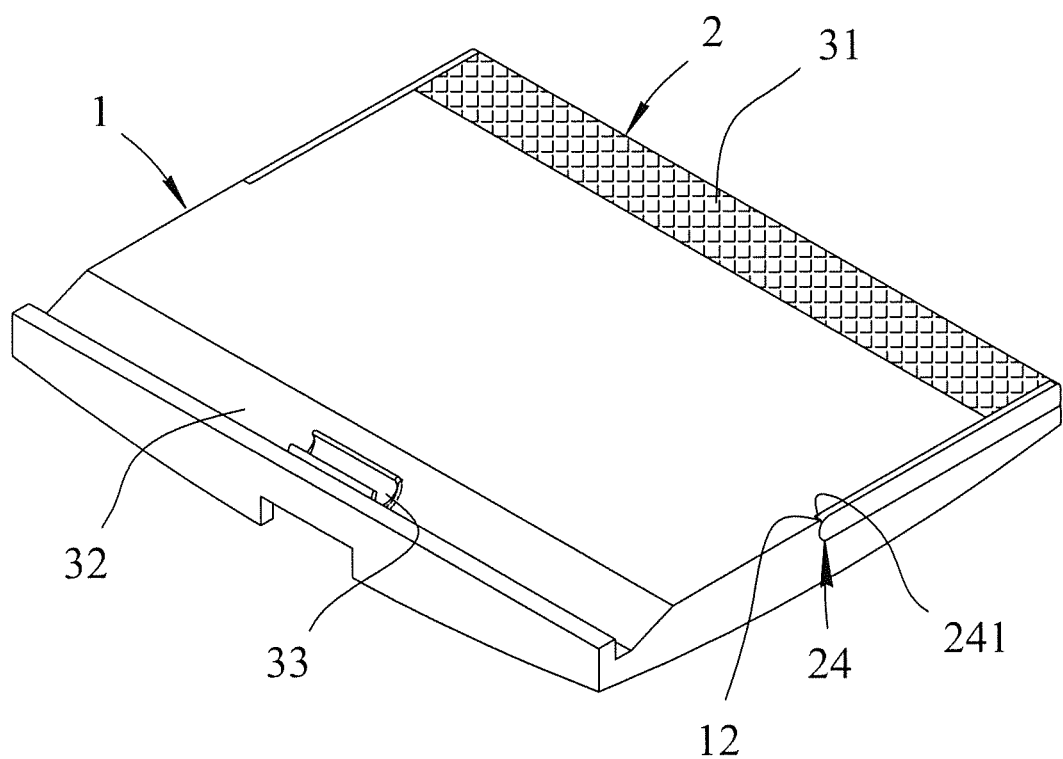
FIG. 12 is a perspective view to show another embodiment of the present invention.

As shown in FIGS. 12 and 13, the groove 32 of the positioning portion 3 includes a recessed area and the support member 33 is located in the recessed area by using a fixing member such as a bolt (not shown) or by way of adhering. The support member 33 can be made by plastic and resilient material so that when rack is set to the desired position, the board-like electronic device 5 is engaged with the groove 32 and the support member 33 clamps the board-like electronic device 5. The back of the board-like electronic device 5 is supported on the transverse bar 21 and positioned. When folding the rack 2, because the support member 33 is made by plastic and resilient material, the groove 32 is able to accommodate the rack to let the desk top 1 to be flat.

The anti-slip material 31 can be used at the positions where the board-like electronic device 5 is in contact. The anti-slip material 31 can be used on the positioning portion 3, the transverse bar 21 of the rack 2, the top of the positioning member 232 and the inside of the stop 234 to position the board-like electronic device 5.

While we have shown and described the embodiment in accordance with the present invention, it should be clear to those skilled in the art that further embodiments may be made without departing from the scope of the present invention.

What is claimed is:

1. A desk assembly comprising:
   a desk top having an angle adjustment unit and a positioning portion, wherein the positioning portion comprises a groove and a support member located in the groove, the support member configured to clamp a device engaged with the groove, and
   a rack pivotably connected to the desk top and having a positioning unit, the rack being pivoted and positioned relative to the desk top;
   wherein the positioning unit of the rack has a slide slot and a positioning member which is movable along the slide slot.

2. The desk assembly as claimed in claim 1, wherein the angle adjustment unit is a friction hinge or a locking knob.

3. The desk assembly as claimed in claim 1, wherein an anti-slip material is connected to the positioning portion.

4. The desk assembly as claimed in claim 1, wherein the slide slot is a toothed rack comprising a plurality of notches.

5. The desk assembly as claimed in claim 1, wherein the positioning member is engaged with or urged to the slide slot.

6. A desk assembly comprising:
   a seat;
   a desk top pivotably connected to the seat and having an angle adjustment unit and a positioning portion, wherein the positioning portion comprises a groove and a support member located in the groove, the support member configured to clamp a device engaged with the groove, and
   a rack pivotably connected to the desk top and having a positioning unit, the rack being pivoted and positioned relative to the desk top;
   wherein the positioning unit of the rack has a slide slot and a positioning member which is movable along the slide slot.

7. The desk assembly as claimed in claim 6, wherein the angle adjustment unit is a friction hinge or a locking knob.

8. The desk assembly as claimed in claim 6, wherein an anti-slip material is connected to the positioning portion.

9. The desk assembly as claimed in claim 6, wherein the slide slot is a toothed rack comprising a plurality of notches.

10. The desk assembly as claimed in claim 6, wherein the positioning member is engaged with or urged to the slide slot.

* * * * *